United States Patent [19]

Camlibel et al.

[11] 4,455,351
[45] Jun. 19, 1984

[54] PREPARATION OF PHOTODIODES

[75] Inventors: Irfan Camlibel, Stirling; Shobha Singh, Summit; LeGrand G. Van Uitert, Morris Township, Morris County; John R. Zuber, Piscataway; George J. Zydzik, Columbia, all of N.J.

[73] Assignee: AT&T Bell Laboratories, Murray Hill, N.J.

[21] Appl. No.: 503,795

[22] Filed: Jun. 13, 1983

[51] Int. Cl.³ ............................................... B32B 9/06
[52] U.S. Cl. ..................................... 428/450; 427/39; 427/87; 427/94; 428/446; 428/697; 428/698; 428/699
[58] Field of Search ............................ 427/39, 87, 94; 428/446, 450, 697, 698, 699

Primary Examiner—Bernard D. Pianalto
Attorney, Agent, or Firm—Walter G. Nilsen

[57] ABSTRACT

A process is described for fabricating various optical devices including photodiodes in which a protective dielectric layer is put down on the surface of the device prior to heating to temperatures over about 250–300 degrees C. Such devices have excellent performance characteristics including low dark current and low noise figures.

10 Claims, 1 Drawing Figure

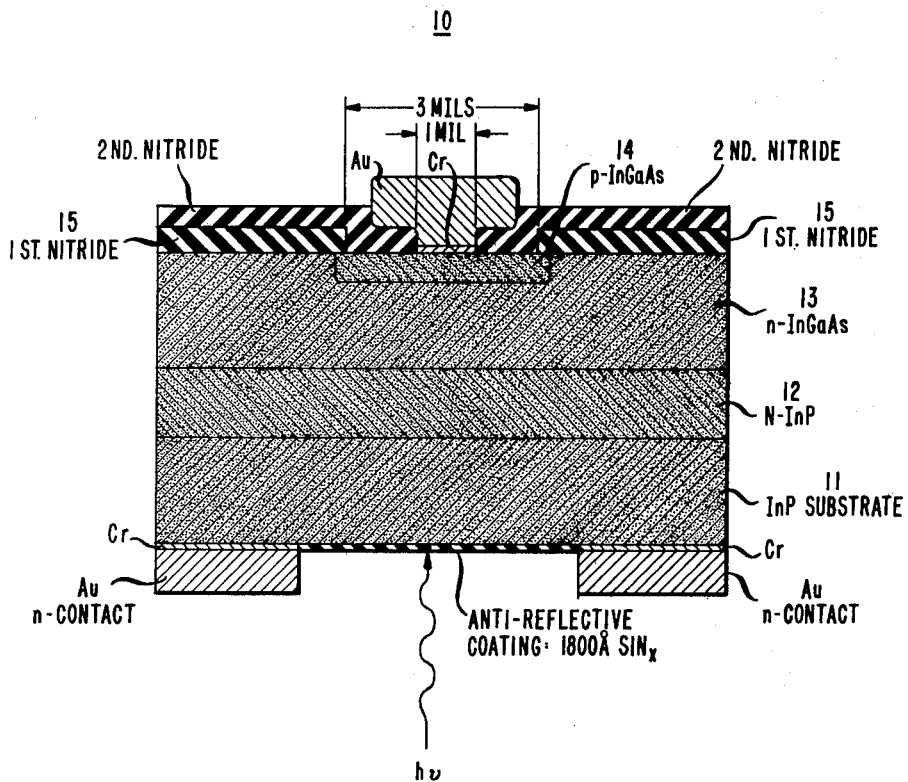

PREPARATION OF PHOTODIODES

TECHNICAL FIELD

The invention is a procedure for making photodetectors using compound semiconductors formed on substrates containing phosphorus. It is particularly directed to photodectors formed in InGaAs films grown on substrates containing InP.

BACKGROUND OF THE INVENTION

The development of optical communication systems has led to considerable activity in the optical device field. Various devices are of importance in optical communication systems, including sources (light-emitting diodes, lasers), transmission media (optical fibers) and detectors. The quality and characteristics of these devices (as well as other devices in the system) contribute significantly to the quality and efficiency of the optical communication system.

A particularly important part of the optical communication system is the photodetector. It contributes significantly to the sensitivity of the receiver in an optical communication system and often determines repeater spacing of an optical communication system. Particularly important is the noise generated at the photodetector and the bandwidth of the photodetector.

In certain wavelength ranges, photodetectors are made with compound semiconductors containing phosphorus. For example, for many photodetector devices operating at about 1.3 $\mu$m (i.e., the 1.25–1.35 $\mu$m region), InP is conveniently used as a substrate material and an epitaxially grown material such as InGaAs is used as the active material. In such devices, low noise is particularly important especially where these photodectors are used in optical communication systems.

An especially important source of noise in photodetectors is dark current. It is highly desirable to minimize dark current in photodetectors because it adversely affects noise performance. Improved noise performance makes possible improved performance in a variety of optical systems including optical communication systems.

SUMMARY OF THE INVENTION

The invention is a process for making optical devices comprising compound semiconductors on substrates containing phosphorus in which a protective layer is put down on the active region prior to exposure of the device to temperatures over about 300 degrees C. Even lower temperature limits are preferred, say 250 degrees C., because devices with lower dark currents and noise figures result. Various protective layers are useful particularly if effective passivation can be produced without raising the sample temperature above about 250 to 300 degrees C. Particularly useful as a protective layer is silicon nitride ($SiN_x$) put down by plasma chemical vapor deposition. Generally, a minimum thickness is required (about 100–300, preferably approximately 200 Angstrom units) before the temperature is raised above 250 to 300 degrees C. A particularly useful procedure is to deposit a limited thickness of dielectric (generally 200 to 500 Angstroms and preferably 300 Angstroms) at a temperature less than 250 degrees C. and then the remaining thickness (generally up to about 5 microns) at less than 400 degrees C. This procedure is highly useful in fabricating photodetectors comprising compound semiconductor material or substrates containing phosphorus because it minimizes dark current of the resulting device. In particular, photodetectors sensitive in the 1.0–1.6 $\mu$m region (generally the region around 1.3 $\mu$m) are often made with InP substrates and either InGaAs active regions (typical composition about $In_{0.53}Ga_{0.47}As$) or InGaAsP (typical composition $In_{0.83}Ga_{0.17}As_{0.37}P_{0.63}$).

BRIEF DESCRIPTION OF THE DRAWING

The FIGURE shows a diagram of a typical photodetector with InP substrate made in accordance with the invention.

DETAILED DESCRIPTION

The invention is based on the discovery that in fabricating photodiodes made from III–V compound semiconductors or substrates containing phosphorus, minimizing exposure to high temperatures while surfaces are exposed (prior to capping with a dielectric) leads to superior properties, especially lower noise and lower dark current or leakage current. Various procedures are available to ensure minimum exposure to high temperatures without sacrificing other device properties, such as device reliability and device lifetime.

The discovery described above has led to certain processing limitations that yield photodiodes with exceptionally desirable properties. These process limitations are as follows: First, the photodiode wafer is not exposed to temperatures above about 300 degrees C. (preferably 250 degrees C.) prior to capping with a dielectric. Second, during diffusion processes where the photodiode is exposed to relatively high temperatures (generally 450 to 650 degrees C. with 500 to 600 degrees C. preferred), the time of diffusion (i.e., time the photodiode is exposed to these high temperatures) should be minimized, generally to less than three hours, preferably to less than two or even one hour.

Also, an additional optional limitation is to remove some of the surface of the active material (generally InGaAs) grown epitaxially at relatively high temperatures on the InP substrate prior to further processing. This is usually done by an etching procedure and usually involves removal of several tenths of a micron. As stated above, this procedure is optional and may be done to thin the epitaxial layer to a desired thickness as well as remove damaged material.

An understanding of the invention would be facilitated by a description of a typical planar PIN photodiode and a general description of a procedure for fabricating such a photodiode. The FIGURE shows a cross-sectional view of a typical confined-contact planar PIN photodiode with double nitride passivation. The structure, 10, is made up of an InP substrate, 11, with a thin buffer layer, 12 (generally 2–6 $\mu$m) of n-type InP. This buffer layer is grown on the substrate by an epitaxial growth procedure, generally liquid phase epitaxial growth. The active layer, 13, is generally made of n-type InGaAs grown by a liquid phase epitaxial procedure. The composition is adjusted to lattice match with the InP buffer layer (typical composition within ±10 mole percent $In_{0.53}Ga_{0.47}As$). The p-type InGaAs, 14, is typically made by diffusing zinc into the InGaAs as described below.

An important aspect of the invention is that this structure should not be exposed to excessively high temperatures for excessively long periods of time before capping either the active material (the InGaAs) or the phosphide containing compound semiconductor with a dielectric or passivating material. Most often the active material is capped with a first SiN layer. A typical procedure is the use of a plasma chemical vapor deposition for typically nine minutes of 250 degrees C. using a mixture of 2 percent SiH$_4$ in argon metered into the reaction chamber at 20 cc/minute and nitrogen gas metered at the rate of 134 cc/minute.

The temperature of the surface can usually be increased after deposition of a few hundred (e.g., 200 Angstroms) of SiN. Typically, the temperature is increased to between 300 and 400 degrees C. However, for convenience, the entire capping process may be carried out at 250 degrees C. and the cap subsequently sintered at 350 degrees C. The thickness of this layer may vary over large limits, typically from several hundred Angstroms to approximately a micrometer.

After capping, the structure may be exposed to higher temperatures, but it is preferred that time of exposure to the higher temperatures be limited when the capping structure is removed. Generally, such a high-temperature exposure is required during diffusion in the p-type region, 14, in the InGaAs.

Typically, the p-type region of the InGaAs is made by exposure to zinc vapor at a temperature below 600 degrees C. (generally 500–600 degrees C. with 550±20 degrees preferred) for a time under two hours (typically about one hour).

A representative procedure is as follows: A window is opened in the first nitride layer generally by a standard positive photoresist procedure. An oxygen plasma etching procedure is used to remove the SiN on the window. The remainder of the photoresist is then removed by standard procedures. There remains a hole in the SiN with diameter typically of 3 mils.

The doping procedure may be carried out in a variety of ways. A typical procedure involves diffusion from the vapor. Arsenic is usually included in the vapor to prevent loss of arsenic from the semiconductor surface. Generally, the wafer is sealed in a quartz ampule containing the arsenic and zinc. For an ampule volume of approximately 6 cc, about 6 mg of arsenic and 3 mg of zinc are used. The ampule is heated to 550 degrees C. for under two hours. The exact time depends on the thickness of the InGaAs layer and the amount of diffusion desired. The wafers are cooled and may be cleaned with a variety of solvents. Wafers are often tested at this point to determine the amount of leakage current.

The remainder of the processing procedure is conventional. A second layer of dielectric is put down as indicated in the FIGURE. A hole is opened (generally about 1 mil) by conventional procedures as described above and chromium and gold put down (typically by electron beam evaporation). Typical thicknesses are, for chromium about 1000 Angstroms, for gold about 13,000 Angstroms. The remainder of the structure is fabricated by conventional means.

Photodiodes with active layers on phosphorus containing substrates fabricated in accordance with the invention typically have substantially lower dark currents than those fabricated at higher temperatures. Using the inventive procedure, PIN photodiodes are regularly made with dark currents in the range from 5 to 20 nanoamperes at room temperatures and 10 volts reverse bias.

What is claimed is:

1. A process for fabricating a semiconductor photodetector from a structure comprising InP substrate with the surface of the InP substrate at least partially covered with active material, said active material consisting generally of an n-type compound semiconductor, said compound semiconductor selected from the group consisting of InGaAs and InGaAsP comprising the step of depositing a protective layer of SiN on at least part of the surface of active material by plasma chemical vapor deposition characterized in that the temperature of the structure remains below 300 degrees C. until the thickness of the SiN layer is greater than 100 Angstroms.

2. The process of claim 1 in which the structure is kept below approximately 250 degrees C. until the protective layer is at least 200 Angstrom units thick.

3. The process of claim 2 in which the structure is kept below 250 degrees C. until the protective layer is at least 300 Angstroms thick and below 400 degrees C. for additional thickness up to 5 microns.

4. The process of claim 1 in which the structure comprises a buffer layer of n-type InP grown by an epitaxial growth procedure between InP substrate and the active material.

5. The process of claim 1 in which the active material has composition within ±10 mole percent of $In_{0.53}Ga_{0.47}As$.

6. The process of claim 1 in which subsequent to depositing the SiN a portion of the active material is made p-type by a diffusion procedure comprising the steps of:
   a. removing a portion of the SiN layer to expose a portion of the surface of the active material;
   b. diffusing zinc into the exposed surface of the active material by contacting said exposed surface with a vapor comprising far less than two hours at a temperature between 500 and 600 degrees C.

7. The process of claim 6 in which arsenic is included in the vapor.

8. The process of claim 7 in which the diffusion takes place in an ampule with volume of approximately 6 cm$^2$ containing approximately 6 mg of arsenic and 3 mg of zinc.

9. The process of claim 6 in which the diffusion temperature is approximately 550 degrees C.

10. The product made in accordance with the process of claim 1.

* * * * *

UNITED STATES PATENT AND TRADEMARK OFFICE
CERTIFICATE OF CORRECTION

PATENT NO. : 4,455,351

DATED : June 19, 1984

INVENTOR(S) : Irfan Camlibel, Shobha Singh, LeGrand G. Van Uitert John R. Zuber and George J. Zydzik It is certified that error appears in the above-identified patent and that said Letters Patent is hereby corrected as shown below:

Column 3, line "on" should read --in--. Column 4, line 16, "generally" should read --essentially--.

Signed and Sealed this

Sixth Day of November 1984

[SEAL]

Attest:

GERALD J. MOSSINGHOFF

Attesting Officer

Commissioner of Patents and Trademarks